United States Patent
Liu

(12) 
(10) Patent No.: US 6,246,116 B1
(45) Date of Patent: Jun. 12, 2001

(54) BURIED WIRING LINE

(75) Inventor: Tien-Jui Liu, Taichung Hsien (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/316,668

(22) Filed: May 21, 1999

(51) Int. Cl.[7] .................................................. H01L 23/48
(52) U.S. Cl. ........................... 257/734; 257/506; 438/423
(58) Field of Search ............................. 438/423; 257/508, 257/734, 506

(56) References Cited

U.S. PATENT DOCUMENTS

| | | | |
|---|---|---|---|
| 3,663,308 | * 5/1972 | Davey | 438/423 |
| 3,897,274 | * 7/1975 | Stehlin et al. | 438/423 |
| 4,939,567 | * 7/1990 | Kenney | 257/508 |
| 5,962,908 | * 10/1999 | Beasom et al. | 257/520 |
| 6,074,929 | * 6/2000 | Thomas | 438/407 |

FOREIGN PATENT DOCUMENTS 55-138267 * 10/1980 (JP) .

* cited by examiner

*Primary Examiner*—T. N. Quach
(74) *Attorney, Agent, or Firm*—Martine Penilla & Kim, LLP

(57) ABSTRACT

A buried wiring line. The structure of the buried wiring line at least comprises a conductive doped region in a provided substrate and a silicon nitride region formed around the conductive doped region in the substrate. The silicon nitride region, which comprises a first silicon nitride below the doped region and a second silicon nitride layer beside the doped region, isolates the buried wiring line from the substrate.

4 Claims, 1 Drawing Sheet

BURIED WIRING LINE

BACKGROUND OF THE INVENTION

1. Field of the Invention

The invention relates in general to a semiconductor integrated circuit (IC) structure, and more particularly to a buried wiring line structure.

2. Description of the Related Art

Polysilicon is usually used as a conductive material for fabricating structures in semiconductor devices such as gate electrodes and bit lines. When the size of the semiconductor device arrives at the deep submicron level, the requirement for a high operating rate creates some device stability problems.

A conventional method for forming a polysilicon wiring line is to deposit a polysilicon layer on a provided substrate by low pressure chemical vapor deposition (LPCVD). A part of the polysilicon layer is etched until the substrate is exposed. The remaining polysilicon layer is thus used as a gate electrode or a bit line. However, the step of etching the polysilicon layer has some disadvantages; for example, the etching process is complicated and the polysilicon layer formed on the substrate occupies layout space. Furthermore, polysilicon grain size, which is affected by thermal processes, affects the resistance of the polysilicon layer. If the resistance of the polysilicon line cannot be controlled accurately, the quality of semiconductor devices thus fluctuates.

Moreover, an etching process is performed to remove a part of the polysilicon layer while forming the polysilicon line. If the polysilicon layer is not removed completely, polysilicon remaining on the substrate may cause unintended connections. If the polysilicon layer is over-etched, the substrate may be damaged, which can cause defects.

A conventional buried bit line is developed to resolve the problems described above. The method of forming the buried bit line comprises the step of implanting a dopant into a substrate. However, the dopant in the substrate easily diffuses due to thermal processes after forming the buried bit line so that the distribution of the dopant cannot be controlled. Resistance of the buried bit line is thus unstable.

SUMMARY OF THE INVENTION

The invention provides a buried wiring line comprising a doped region in a provided substrate and a silicon nitride region formed around the doped region in the substrate. The doped region is used as the buried wiring line. The silicon nitride region isolates the buried wiring line from the substrate.

Forming the buried wiring line comprises steps of implanting a conductive dopant into a provided substrate to form a first silicon nitride layer using a nitric gas source. A conductive doped region is formed in the substrate above the first silicon nitride layer. A second silicon nitride layer is formed in the substrate beside the conductive doped region. The first silicon nitride layer and the second silicon nitride constitute a silicon nitride region around the conductive doped region so that the conductive doped region is isolated from the substrate.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1A:
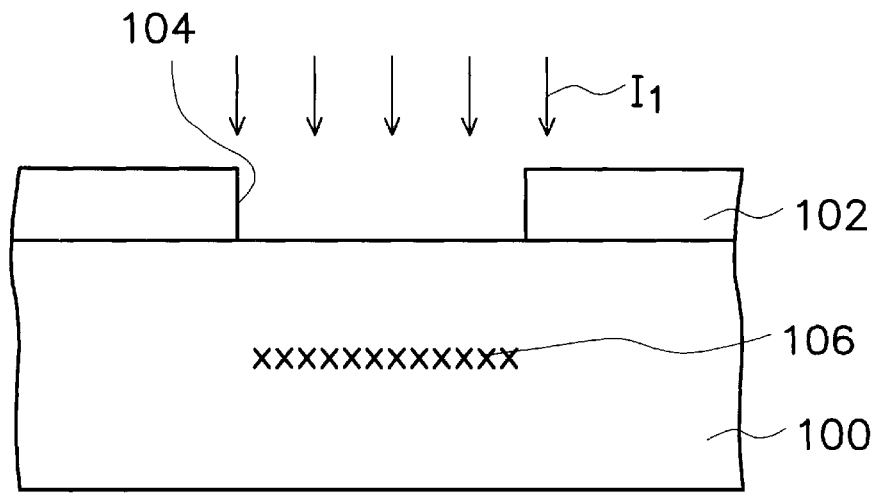
FIGS. 1A to 1C are schematic, cross-sectional views showing the process steps for forming a buried wiring line according to one preferred embodiment of the invention.
Figure 1B:
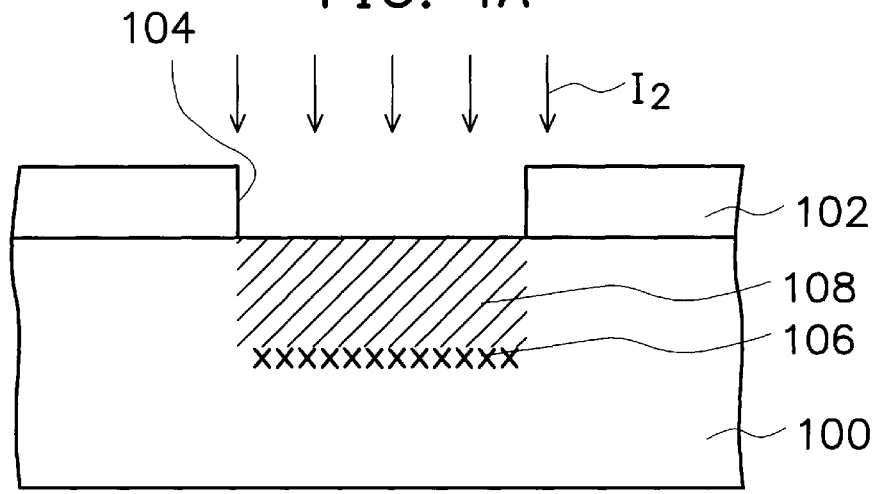
Figure 1C:
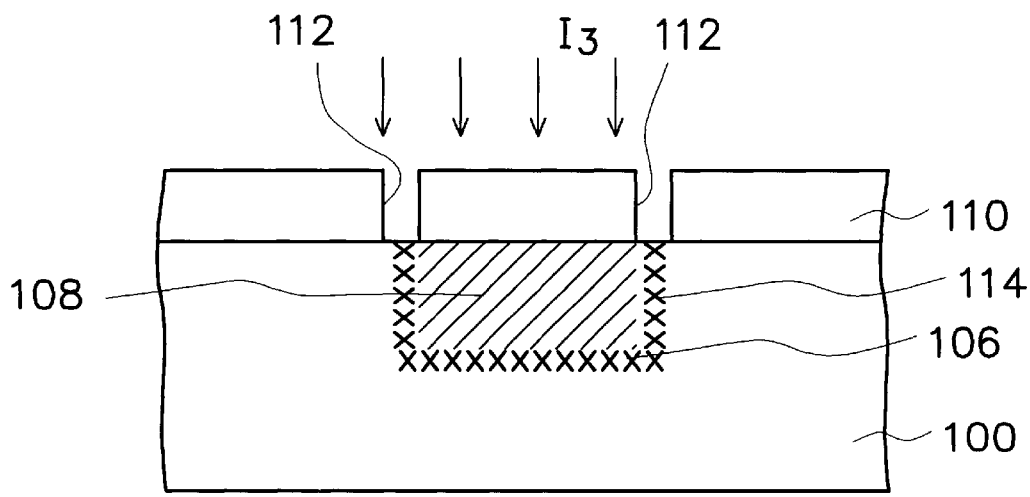

FIGS. 1A to 1C are schematic, cross-sectional views showing the process steps for forming a buried wire line according to one preferred embodiment of the invention.

In FIG. 1A, a substrate 100 is provided. A mask 102 is provided over the substrate 100. The mask 102 has an opening 104 exposing a part of the substrate 100. A first implanting process $I_1$ is performed to form a first isolating region 106, such as a silicon nitride layer, within the substrate 100. A nitric gas containing, for example, $N_2^+$ or $N^+$, is used as a gas source so that the nitric gas can react with silicon of the substrate to form silicon nitride.

In FIG. 1B, a second implanting process $I_2$ is performed to dope conductive ions into the substrate 100 positioned above the first silicon nitride layer 106. A conductive doped region 108 is thus formed. The conductive type of the doped region 108 and the conductive type of the substrate 100 are opposite. If the substrate 100 is an N-type substrate, the doped region 108 contains P-type dopant, such as boric ions ($B^+$). If the substrate 100 is a P-type substrate, the doped region 108 contains N-type ions, such as arsenic (AS) or phosphorus (P).

In FIG. 1C, the mask 102 is removed. Another mask 110 is provided over the ubstrate 100. The mask 110 has a opening 112 exposing a part of the substrate 100. A third implanting process $I_3$ is performed to form a second isolating region 114, such as a silicon nitride layer, within the substrate 100 beside the doped region 108. A nitric gas containing, for example, $N_2^+$ or $N^+$, is used as a gas source so that the nitric gas can react with silicon of the substrate to form silicon nitride. The first silicon nitride layer 106 and the second silicon nitride layer 114 surround the doped region 108 so that the doped region 108 is isolated from the substrate 100.

In the invention, three ion implanting processes are respectively performed to form the conductive doped region as a buried wiring line and to form an isolating region (silicon nitride region) around the buried wiring line. Dopant diffusion of the buried wiring line is thus prevented. Resistance of the buried wiring line can be controlled by adjusting a dopant dosage of the doped region. Since the buried wiring line is formed within the substrate instead on the substrate, layout dimension can be decreased. Furthermore, no etching step is required to remove polysilicon so that the quality of the substrate is not affected by etching damage or residual polysilicon on the substrate.

It should be noticed that the order of the implanting processes described above can be inverted; for example, the second silicon nitride layer would be formed after forming the first silicon nitride layer and then the doped region would be formed within the substrate isolated by the first and the second silicon nitride layers. The step order described in the embodiment is just an example. The implanting processes further comprise drive-in steps to drive the dopant to a predetermined position in the substrate. The implanting processes are well known techniques. It is easy for one skilled in the art to perform the processes, so the steps are not here described in detail.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A buried wiring line, comprising:

a substrate;

a conductive doped region within the substrate, the conductive doped region having a conductivity type that is opposite of a conductivity type of the substrate; and an isolating region in the substrate around the conductive doped region, the isolating region being comprised of silicon nitride.

2. A buried wiring line, which is formed in a provided substrate, comprising:

a first silicon nitride layer, which is formed in the provided substrate by performing a first implanting process;

a conductive doped region having a conductivity type that is opposite of a conductivity type of the provided substrate, which is formed in the substrate above the first silicon nitride layer by performing a second implanting process; and a second silicon nitride layer, which is formed in the substrate beside the conductive doped region by performing a third implanting process.

3. The buried wiring line according to claim 2, wherein the first implanting process and the second implanting process are performed using a nitric gas as a source.

4. A buried wiring line, which is formed in a provided substrate, comprising:

a first silicon nitride layer, which is formed in the provided substrate by performing a first implanting process;

a second silicon nitride layer formed in the substrate above the first silicon nitride to isolate a region of the substrate, the second silicon nitride layer being formed by performing a second implanting process; and a conductive doped region formed in the isolated region of the substrate above the first silicon nitride layer and beside the second silicon nitride layer, the conductive doped region having a conductivity type that is opposite of a conductivity type of the provided substrate, and the conductive doped region being formed by performing a third implanting process.

* * * * *